(12) United States Patent
Tanabe

(10) Patent No.: US 8,508,055 B2
(45) Date of Patent: Aug. 13, 2013

(54) SEMICONDUCTOR DEVICE AND MANUFACTURING METHOD THEREOF

(75) Inventor: Akihito Tanabe, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 20 days.

(21) Appl. No.: 13/064,481

(22) Filed: Mar. 28, 2011

(65) Prior Publication Data

US 2011/0175241 A1 Jul. 21, 2011

Related U.S. Application Data

(63) Continuation of application No. 11/580,036, filed on Oct. 13, 2006, now Pat. No. 7,928,586.

(30) Foreign Application Priority Data

Oct. 14, 2005 (JP) ................................. 2005-299674

(51) Int. Cl.
*H01L 23/48* (2006.01)

(52) U.S. Cl.
USPC ........... 257/782; 257/784; 257/786; 257/797; 257/E23.179

(58) Field of Classification Search
USPC ............................ 257/782, 784, 797, E23.179
See application file for complete search history.

(56) References Cited

U.S. PATENT DOCUMENTS

| | | | |
|---|---|---|---|
| 6,351,405 B1 * | 2/2002 | Lee et al. ......................... | 365/63 |
| 6,417,575 B2 | 7/2002 | Harada et al. | |
| 6,844,631 B2 | 1/2005 | Yong et al. | |
| 6,900,551 B2 | 5/2005 | Matsuzawa et al. | |
| 6,921,979 B2 * | 7/2005 | Downey et al. ................ | 257/773 |
| 7,282,940 B2 | 10/2007 | Hirai | |

(Continued)

FOREIGN PATENT DOCUMENTS

| | | |
|---|---|---|
| JP | 2001-177066 | 6/2001 |
| JP | 2001-177066 A | 6/2001 |

(Continued)

OTHER PUBLICATIONS

Japanese Office Action dated Dec. 20, 2011, with partial English translation.

*Primary Examiner* — Lynne Gurley
*Assistant Examiner* — Vernon P Webb
(74) *Attorney, Agent, or Firm* — McGinn IP Law Group, PLLC

(57) ABSTRACT

A semiconductor device includes a bonding pad, and an area designation marking, wherein the bonding pad includes a first region, a second region, and a third region placed between the first region and the second region, wherein the area designation marking includes a first area designation mark configured to designate a first boundary between the first region and the third region and a second area designation mark configured to designate a second boundary between the second region and the third region, wherein the first region and the second region are configured to be contacted with a test probe. The first area designation mark includes a first notch or a first protrusion. The second area designation mark includes a second notch or a second protrusion. The first area designation mark includes a first pair of notches that is linearly spaced apart from each other to designate the first boundary line.

12 Claims, 16 Drawing Sheets

(56) References Cited

U.S. PATENT DOCUMENTS

| | | |
|---|---|---|
| 2002/0125584 A1* | 9/2002 | Umehara et al. ............... 257/786 |
| 2003/0197289 A1 | 10/2003 | Lin |
| 2004/0069988 A1 | 4/2004 | Lin et al. |
| 2004/0232446 A1 | 11/2004 | Nishimura et al. |
| 2006/0028221 A1 | 2/2006 | Hasegawa |
| 2006/0186405 A1* | 8/2006 | Tanabe ............................ 257/48 |

FOREIGN PATENT DOCUMENTS

| | | |
|---|---|---|
| JP | 2001-338955 | 12/2001 |
| JP | 2001-351920 A | 12/2001 |
| JP | 2003-257969 A | 9/2003 |
| JP | 2003-338519 A | 11/2003 |
| JP | 2005-527968 A | 9/2005 |
| JP | 2005-286266 A | 10/2005 |

* cited by examiner

Fig. 9
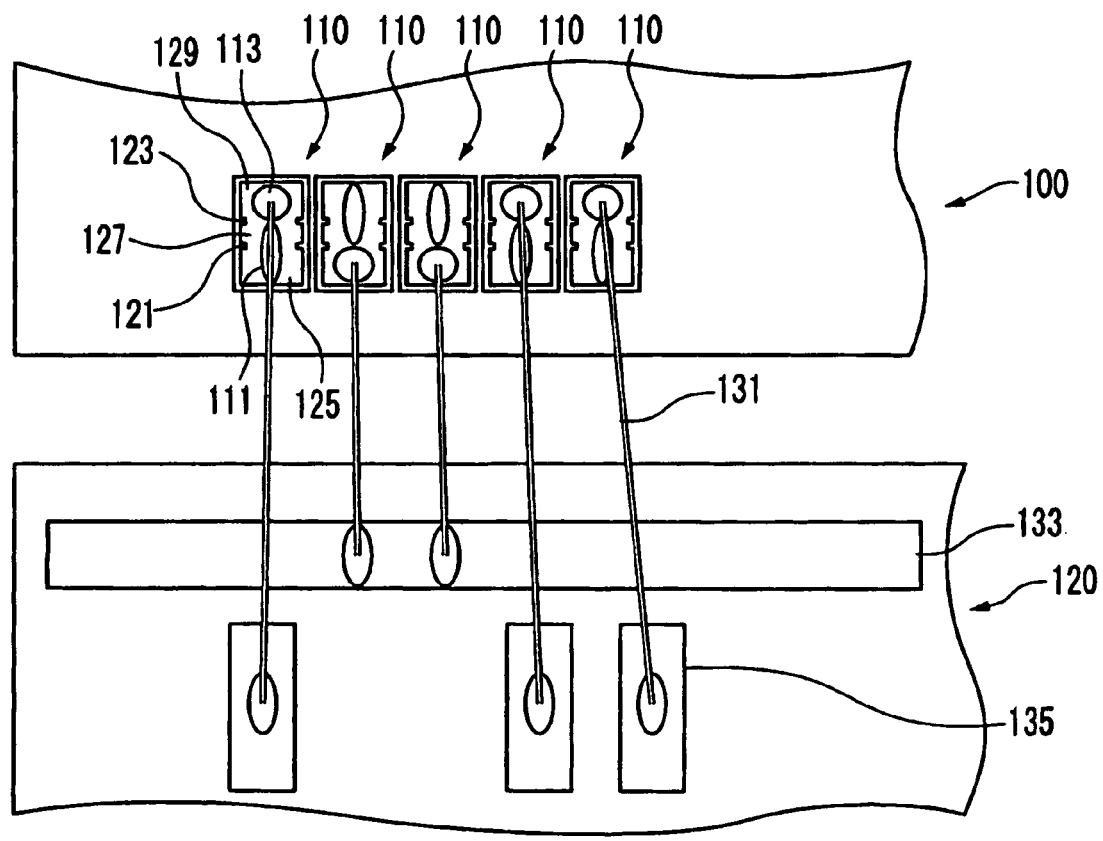
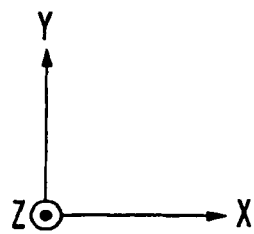

SEMICONDUCTOR DEVICE AND MANUFACTURING METHOD THEREOF

The present application is a Continuation Application of U.S. patent application Ser. No. 11/580,036, filed on Oct. 13, 2006.

This application is based upon and claims the benefit of priority from Japanese patent application No. 2005-299674, filed on Oct. 14, 2005, the disclosure of which is incorporated herein in its entirety by reference.

BACKGROUND OF THE INVENTION

1. Field of the Invention

The present invention relates to a semiconductor device having bonding pads and a manufacturing method thereof.

2. Description of the Related Art Japanese Laid Open Patent Applications JP-P 2001-338955A and JP-P 2001-177066A disclose bonding techniques of semiconductor devices. In these documents, a bonding pad having a bonding region to which a bonding wire is bonded and a probe contact region to which a test probe contacts is described.

In the document JP-P 2001-338955A, a bonding pad having bonding region 334 and probe contact region 336 as shown in FIG. 1 is described. Also in this document, a bonding pad having a bonding region, a probe contact region, and notches located at the both sides of the boundary between the bonding region and the probe contact region is disclosed.

In the document JP-P 2001-177066A, an integrated circuit device having a bonding pad is disclosed. In this document, a bonding section is formed to be a square form, for the location being confirmed automatically by a bonding device.

SUMMARY OF THE INVENTION

There is usually a difference between the size or shape of the region (called as "to-be-bonded region" or "bonding region") occupied by a bonded bonding wire on a bonding pad and those of the region (called as "to-be-scrubbed region" or "probing scratch") scrubbed by the probing process. For example, if the bonding sections are placed in a zigzag arrangement shown as in FIG. 1 on the bonding pads shown as in FIG. 2, the bonding regions 213 and probing scratches 211 are arranged as shown in FIGS. 3 and 4. The notches 211 correspond to the notches 396 in FIG. 2.

In the example shown in FIG. 3 or 4, the first region 225 on which the probing scratch 211 is located and the second region 229 on which the bonding region is located are adjacent to each other in y-axis direction. In the case that the bonding regions 213 are arranged in the zigzag arrangement as shown in FIG. 3 or 4, both of the sizes of the first region and the second region are set to be adequately large to include bonding region. And at the same time, also both of the sizes of the first region and the second region are set to be adequately large to include probing scratch.

In the case shown in FIG. 3 or 4, the length of the probing scratches in y-axis direction is larger than those of the bonding regions. The sizes of the first regions and the second regions in y-axis direction are set to be larger than the length of the probing scratches. As a result, in the first region 225 or second region 229 on which the bonding region are located, there is a margin on which neither probe nor bonding wire are contacted. There may be a room for improvement in this margin from the viewpoint of the economical use of the space of bonding pads and the integration degree of the semiconductor device including the bonding pads.

In the technique described in the document JP-P 2001-177066A, a single boundary notch between the bonding part and the probing part is shown and the bonding region is fixed to a predetermined region on the bonding pad. Thus, the bonding part cannot be freely selected after forming the bonding pad. Furthermore, since the bonding region on the bonding pad is determined in advance, when a semiconductor device with the bonding pads is connected to a mounted substrate or the like, the place that can be connected to an outside electrode is restricted to the fixed region. Therefore, there is room for improvement in terms of flexibility in design change after formation of the bonding pads.

As described above, according to the present invention, it is possible to ensure the connection reliability of the bonding pad and provide a semiconductor device with bonding pads having desirable flexibility in selection of the bonding region.

BRIEF DESCRIPTION OF THE DRAWINGS

FIG. 9 is the plan view showing a configuration of the semiconductor device in accordance with the present embodiment;

DESCRIPTION OF THE PREFERRED EMBODIMENTS

Figure 1:
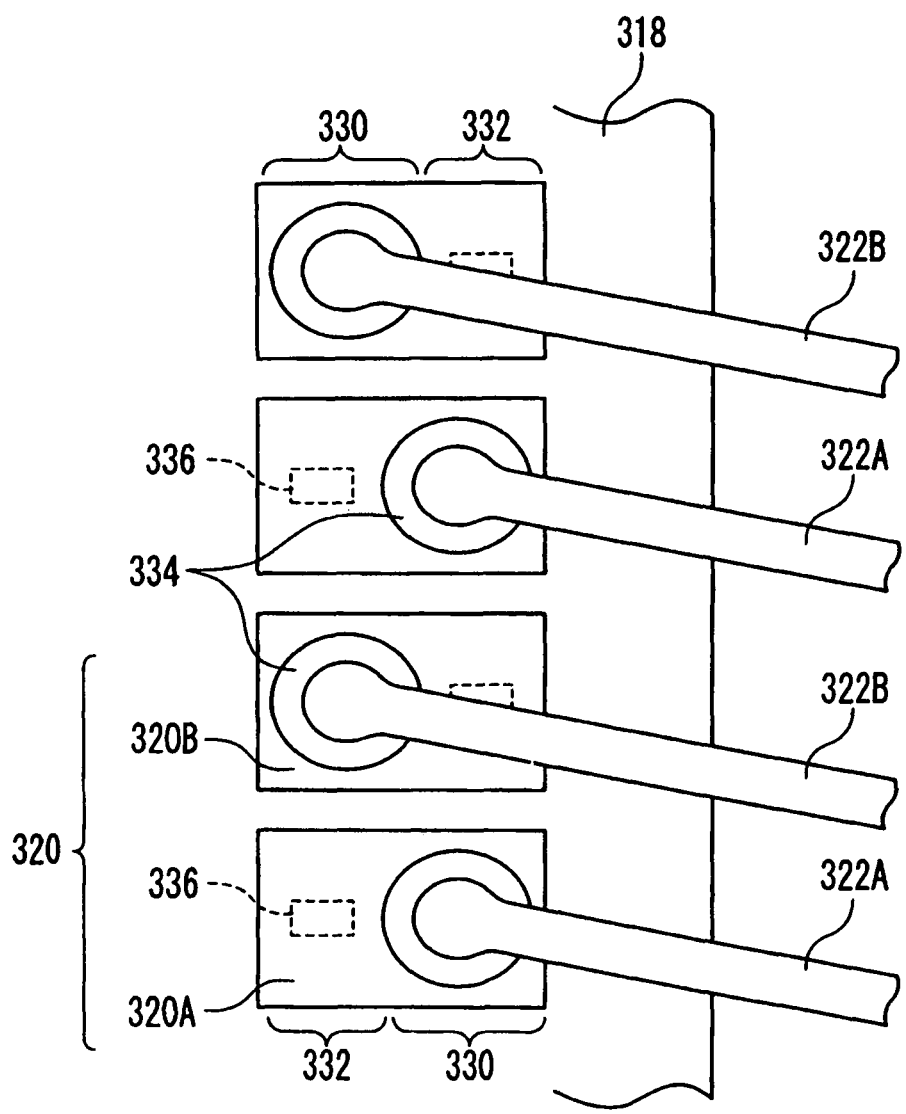
FIG. 1 is the plan view showing a configuration of a conventional semiconductor device.

Hereinafter, embodiments of the present invention will be described referring to the drawings. In the figures, the components indicated by an identical numeral are common components and the redundant explanation is avoided in the following description.

Figure 5:
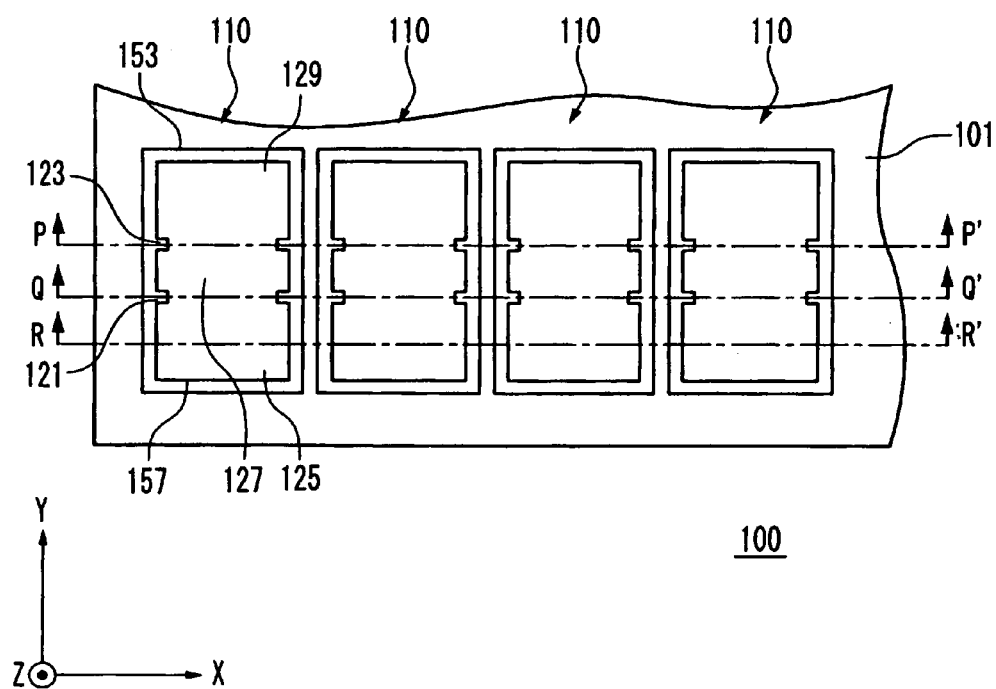
FIG. 5 is the plan view showing a configuration of a semiconductor device in accordance with the present embodiment.

FIG. 5 is a plan view showing the configuration of the semiconductor device according to the first embodiment.

The semiconductor device 100 shown in FIG. 5 includes bonding pads 110 and area indication marks provided at the respective bonding pads 110. Each bonding pad 110 includes a first region 125, a second region 129 and a third region 127 provided between the first region 125 and the second region 129. The first region 125, the second region 129 and the third region 127 are electrically connected and have a same potential. Each area indication mark includes first area indication marks (first notches 121) indicating the first boundary (Q-Q') between the first region 125 and the third region 127 and second area indication marks (second notches 123) indicating the second boundary (P-P') between the second region 129 and the third region 127. Both the first region 125 and the second region 129 are configured so that they can serve as a test probe contact region (a region where a probing scratch 111 is to be formed).

Furthermore, it is possible to arbitrarily use either a region formed of the first region 125 and the third region 127 or a region formed of the second region 129 and the third region 127 as the test probe contact region for the probing scratch 111 and use a region which is not selected as the test probe contact region, of the first region 125 and the second region 129, as the bonding region (bonding part forming region where an end of a bonding wire is to be connected). As shown in FIG. 5, a planar shape of the region formed of the first region 125 and the third region 127 is designed to be substantially same as a planar shape of the region formed of the second region 129 and the third region 127.

The bonding pad 110 is a region where a conductive material such as metal is exposed on the device formed surface of the silicon substrate 101.

Each bonding pad 110 is provided with a test probe contact region on which the test probe is to be contacted and the probing scratch 111 is to be formed, and the bonding part forming region on which the bonding part 113 is to be formed. The first notches 121 and the second notches 123 divide the test probe contact region and the bonding part forming region. The bonding pad 110 is configured so as to enable the detection of the boundary between the bonding part forming region and the test probe contact region on the basis of position of the first notches 121 and the second notches 123. The first notches 121 and the second notches 123 are formed so as to be recognizable on the device forming surface of the semiconductor device 100 through visual check or observation using a camera or a microscope.

In the semiconductor device 100, a plurality of bonding pads 110 are arranged in a line. The first region 125, the third region 127 and the second region 129 of the bonding pad 110 are arranged in a line in a direction (parallel to y-axis drawn in FIG. 5) vertical to the arrangement direction (parallel to x-axis drawn in FIG. 5) of the plurality of bonding pads 110. The first notches 121 and the second notches 123 are provided at each of the plurality of bonding pads 110. The first notches 121 are arranged in a line on a predetermined straight line (Q-Q'). The plurality of second notches 123 are also arranged in a line on a predetermined straight line (P-P').

Figure 3:
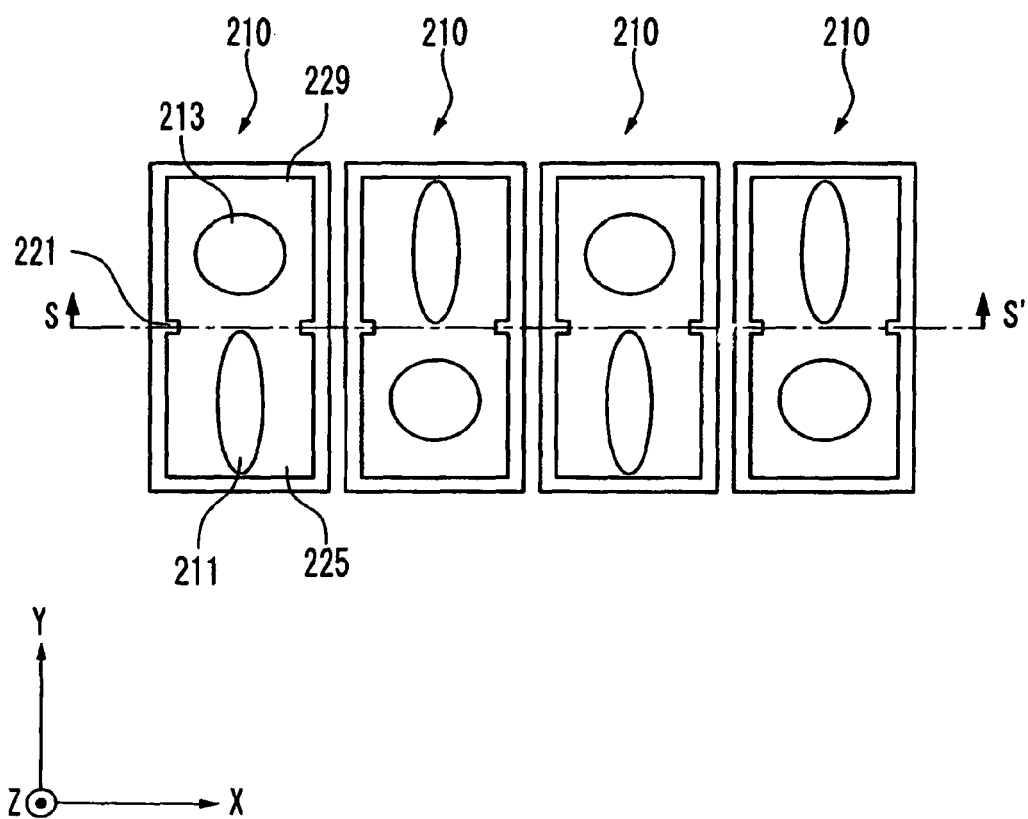
FIG. 3 is the plan view of a semiconductor device for explaining the problem to be solved through an embodiment of the present invention.
Figure 4:
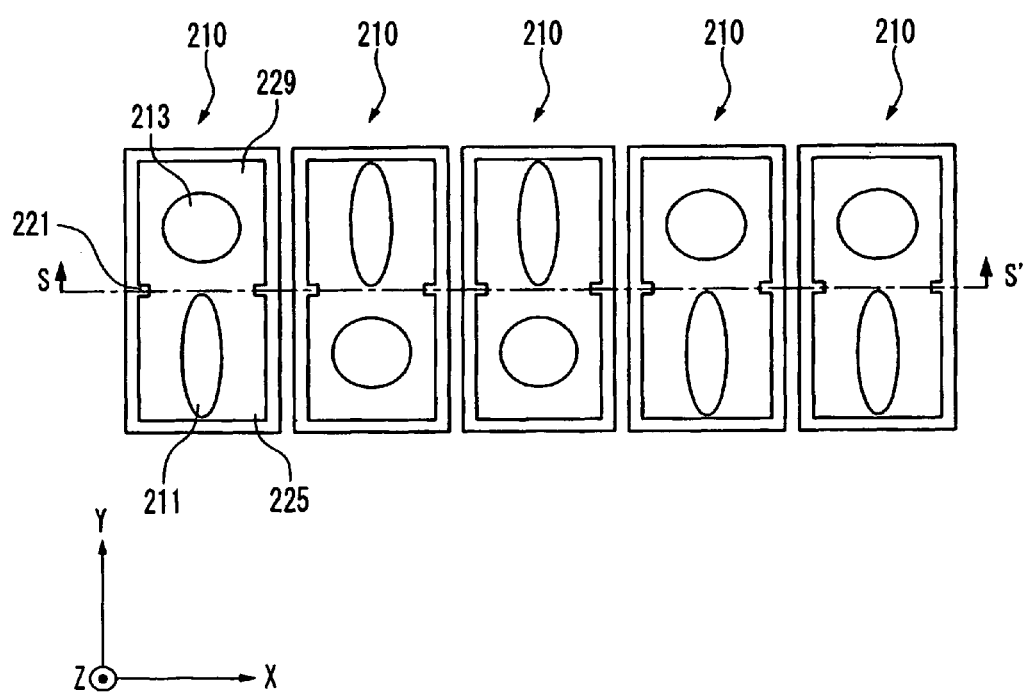
FIG. 4 is the plan view of a semiconductor device for explaining the problem to be solved through an embodiment of the present invention.

In the semiconductor device 100, the first region 125, the third region 127 and the second region 129 are arranged in this order. The bonding pad 110 is shaped to be a plane symmetrical about a central axis extending in a direction (x-axis direction) vertical to the aligning direction (y-axis direction) of the first region 125, the third region 127 and the second region 129. Owing to this symmetrical shape, both in the cases where the probing scratch 111 is formed to the first region 125 side and where the probing scratch 111 is formed to the second region 129 side, a contact of the test probe can be performed under the same condition. Furthermore, both in the cases where the first region 125 is used as the bonding part 113 and the second region 129 is used as the bonding part 113, bonding can be performed under the same condition. Therefore, in the semiconductor device 100 in which the plurality of bonding pads 110 are arranged in a line, such configuration is suitable for the case where the bonding parts 113 are arranged, for example, in the zigzag manner like shown in FIGS. 3 and 4.

In the present embodiment and following embodiments, the symmetry of the planar shape means that symmetry needs to be ensured to the extent that probing can be performed under the same condition both in the cases where the test probe is made into contact with the first region 125 and the test probe is made into contact with the second region 129. The region which is described as symmetrical in the following description may have deviations which can be occurred with the manufacturing process as long as they fall within the above-mentioned extent.

Figure 7:
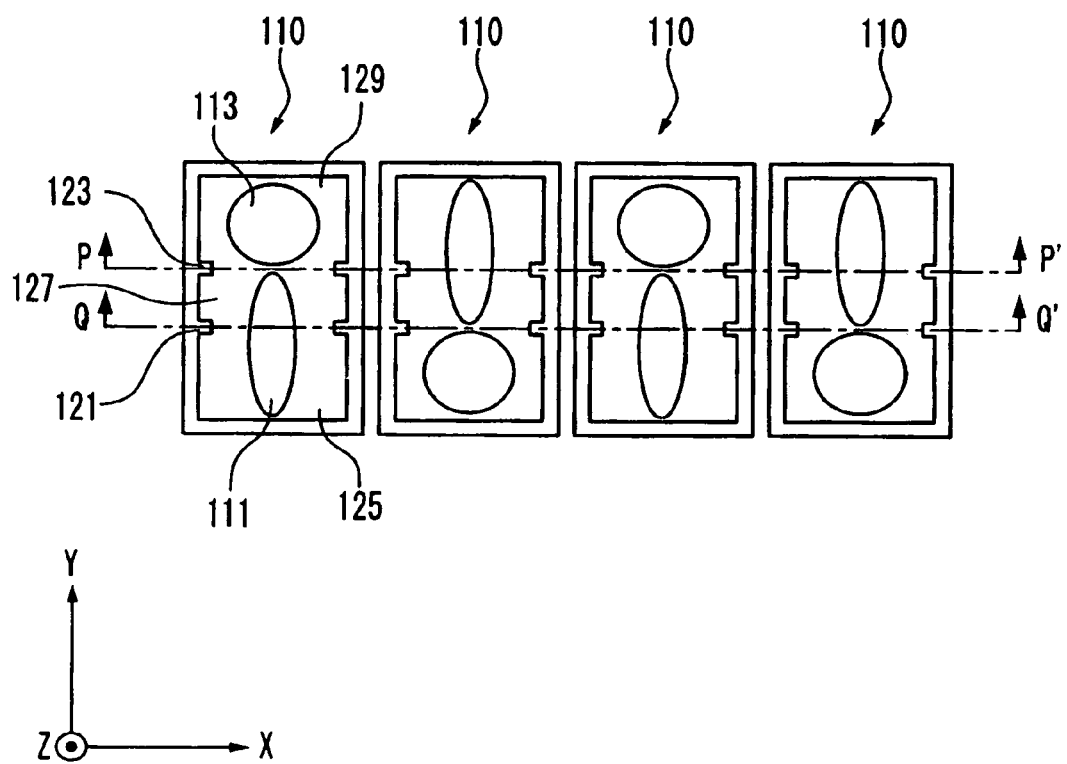
FIG. 7 is the plan view showing a configuration of the semiconductor device in accordance with the present embodiment.
Figure 8:
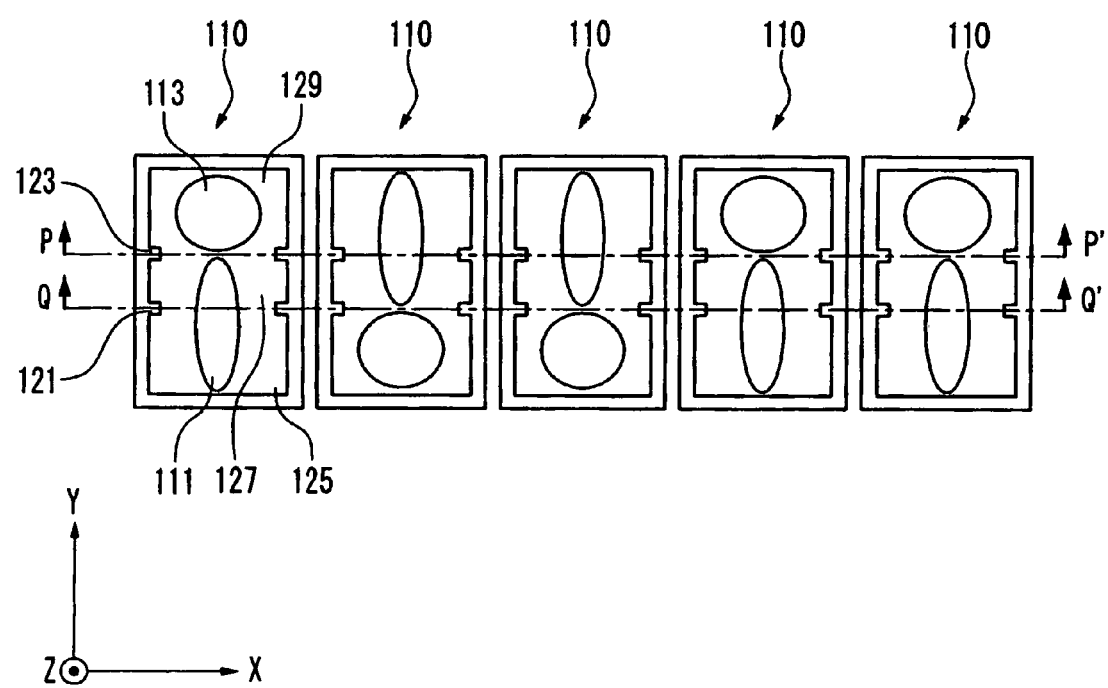
FIG. 8 is the plan view showing a configuration of the semiconductor device in accordance with the present embodiment.

In the present embodiment and the following embodiments, as a mode of arranging the bonding parts 113 in the zigzag manner, in the plurality of bonding pads 110 arranged in a line (parallel to x-axis), the bonding parts 113 are alternately provided in the first regions 125 and the second regions 129 (as shown in FIG. 7). As another mode of arranging the bonding parts, a definite number of bonding pad 110 is set as one unit and the bonding parts 113 are alternately provided in the first regions 125 and the second regions 129 by the unit. An example of such mode is shown in FIG. 8, in which adjacent two bonding pads 110 are set to the unit. In FIG. 8, along the arrangement direction (parallel to x-axis) of the bonding pads 110, the bonding parts 113 are arranged in the second region 129, the first region 125, the first region 125, the second region 129 and the second region 129 from left in the figure.

In the bonding pad 110, the first region 125 and the second region 129 are substantially axisymmetric to each other with the line of symmetry placed in the third region 127.

The bonding pad 110 is shaped in a substantially rectangular plane and the first notches 121 and the second notches 123 are provided along the long sides (parallel to y-axis) of the rectangle. The first notches 121 include two notches placed along the opposed sides of the rectangle. The second notches 123 also include two notches placed along the opposed sides of the rectangle. The first notches 121 are disposed as opposed to each other and the second notches 123 are disposed as opposed to each other. In the present specification, it is enough for the rectangular plane to have a straight line portion only in at least one part of the contour of the plane. For example, corners of the rectangles may be formed to be round through the manufacturing process. In the bonding pad 110, the planar shapes of the first region 125, the second region 129 and the third region 127 are substantially rectangular. This ensures symmetry of the test probe contact region.

The widths of the first region 125 and the second region 129 of the bonding pad 110 is determined in accordance with the width of the bonding region. The width of the region formed of the first region 125 and the third region 127 and the width of the region formed of the second region 129 and the third region 127 are determined in accordance with the test probe contact region. Here, a width of the region means the length between ends of the region in a predetermined direction. For example, in FIG. 5, since the bonding pad 110 is shaped like a rectangular plane, on a side of the rectangle, at which the first notch 121 and the second notch 123 are provided, that is, a long side, the length between the first notch 121 and the opposite corner on the side of the first notch 121 is the width of the first region 125. The length between the second notch 123 and the opposite corner on the side of the second notch 123 is the width of the second region 129. The length between the first notch 121 and the second notch 123 placed on the same side is the width of the third region 127.

FIGS. 6(a) and 6(b) are sectional views of the bonding pad 110 shown in FIG. 5. FIG. 6(a) is a sectional view of the bonding pad 110 taken along Q-Q' and FIG. 6(b) is a sectional view of the bonding pad 110 taken along R-R'.

As shown in FIGS. 6(a) and 6(b), the bonding pad 110 includes a semiconductor substrate (the silicon substrate 101) on which elements such as a transistor and the like are formed, an insulating layer (a multilayer 103) which is formed on the silicon substrate 101 and provided with a depressed portion 155 having a predetermined plane shape, a conductive layer (an Al layer 107) which covers the region where the depressed portion 155 of the multilayer 103 is formed and is provided from the inner side to the outer side of the depressed portion 155 and a polyimide layer 105 which covers the Al layer 107 in the vicinity area of the periphery of the Al layer 107. The area indication marks (the first notches 121 and the second notches 123) are provided on an outer circumference of side surfaces of the depressed portion 155 (depressed portion side wall 157). In other words, the area indication marks are provided on a side surface which connect the top surface of the multilayer 103 and the bottom surface of the depressed portion 155.

The area indication marks are notches (the first notches 121 and the second notches 123) provided on the outer circumference of the depressed portion 155. The first notches 121 and the second notches 123 are formed so as to protrude from the circumference of the bonding pad 110 toward the inside thereof.

Figure 6:
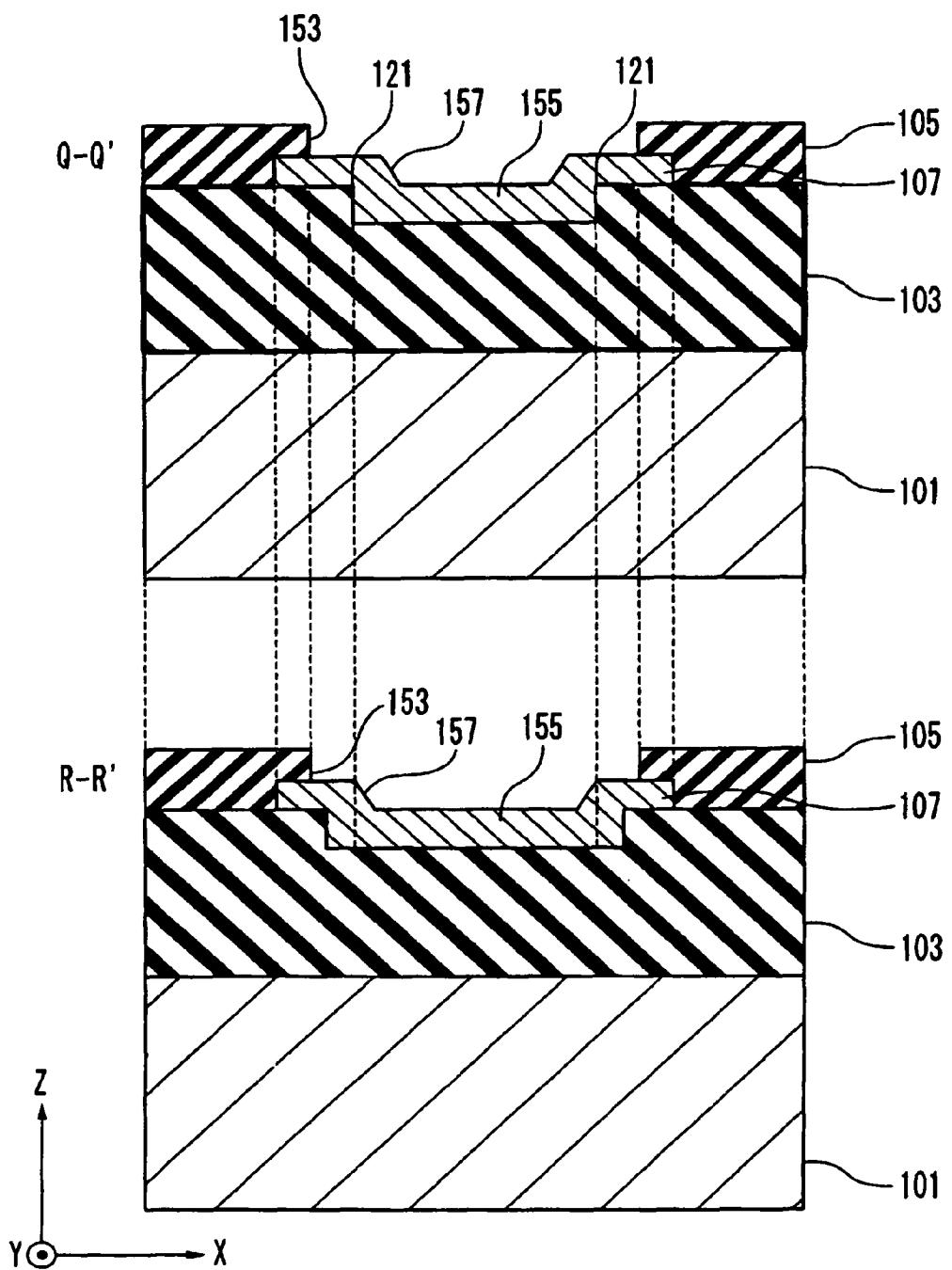
FIG. 6 is a sectional view showing a bonding pad of the semiconductor device shown in FIG. 1.

The polyimide layer 105 functions as a passivation layer and covers an upper surface of the multilayer 103. The polyimide layer 105 is provided with an opening which is equivalent to or which is one size larger than the depressed portion 155 at a position corresponding to an upper part of the depressed portion 155. The opening is formed on the region where the bonding pad 110 is formed and an opening side wall 153 defines the profile of the bonding pad 110. The plane shape of the opening side wall 153 is substantially rectangular. Although FIGS. 5 and 6 show an example in which a polyimide is used as an organic resin, the polyimide may be substituted by PBO (polybenzoxazole) as the organic resin. In this case, a PBO layer can be provided in place of the polyimide layer 105. The polyimide layer 105 covers the circumference and vicinity of the forming region for the Al layer 107 and Al layer 107 is exposed at a region which is not covered with the polyimide layer 105, that is, the opening.

In the depressed portion 155 formed on the multilayer 103, the first notches 121 and the second notches 123 are provided on the depressed portion side wall 157. In the bonding pad 110, the outline of the depressed portion side wall 157 define two boundary lines, that is, the boundary line between the first region 125 and the third region 127 and the boundary line between the second region 129 and the third region 127. The first notches 121 and the second notches 123 are provided in the vicinity of the circumference of the bonding pad 110.

It is desirable that the length of the short sides of the rectangle of a bonding pad 110 is set as long as possible so that the bonding pad 110 may not contact against an adjacent bonding pad 110. An upper limit of a side of the bonding pad 110 is not especially limited. However, it is desirable that the length of long sides of the rectangle is 130 μm or less, more preferably, 100 μm or less. A predetermined number of the bonding pads 110 are arranged at predetermined positions on the silicon substrate 101.

Next, a manufacturing method of an apparatus with the semiconductor device 100 will be described. This manufacturing process includes the following steps.

A step of preparing the semiconductor device 100, a step of detecting the first boundary (Q-Q') or the second boundary (P-P') by detecting the first notches 121 and the second notches 123 and on the basis of the detected boundary, bringing the test probe into contact with the region formed of the first region 125 and the third region 127 or the region formed of the second region 129 and the third region 127, and a step of bonding external connection conductor (a wire 131 shown in FIG. 9) to the second region 129 or the first region 125 after the above-mentioned contact step of the test probe on the basis of the detected boundary Q-Q' or P-P'.

The external connection conductor is, for example, a conductor used for a wire bonding connection.

Hereinafter, the method will be described more specifically. An example of the manufacturing procedure of the semiconductor device 100 will be described below.

First, the multilayer 103 formed by laminating a wire layer, an interlayer insulating layer is formed on the silicon substrate 101. Then, the depressed portion 155 is formed at a predetermined position on the multilayer 103. At this time, the planar shape of the depressed portion side wall 157 is formed to have the first notches 121 and the second notches 123.

Next, the Al layer 107 is formed on the multilayer 103. Subsequently, the Al layer 107 is patterned to be shaped of the bonding pad 110. At this time, the Al layer 107 is patterned so as to project outward from the circumference of the bonding pad 110 by predetermined length.

Subsequently, the polyimide layer 105 is formed over an upper surface of the patterned Al layer 107 according to a coating or application method. A mask pattern having a planar shape corresponding to the shape of the bonding pad 110 is provided on the polyimide layer 105. Using this mask, by selectively removing the region where the bonding pad 110 is to be formed, the opening is formed on the polyimide layer 105 to expose the Al layer 107 through the opening. Through the above-mentioned procedure, the semiconductor device provided with the bonding pad 110 can be manufactured.

In the semiconductor device 100 thus manufactured, since the surface of the Al layer 107 has a difference in level corresponding to the shape of the depressed portion 155 as shown in FIG. 6, when the bonding pad 110 is viewed from above the surface on which devices like transistors are to be formed, the first notches 121 and the second notches 123 can be visually recognized by reflection of light on the Al layer 107.

After that, the test probe is brought into contact with the probe contact region of the bonding pad 110 for a needle mark checking. At this time, using the first notches 121 or the second notches 123, the boundary of the test probe contact region of the probe is detected. Specifically, position of the boundary P-P' or the boundary Q-Q' is detected and the probe is brought into contact with a region placed on the side of the first region 125 from the boundary P-P' or a region placed on the side of the second region 129 from the boundary Q-Q' and slid on the bonding pad 110. At this time, in the test probe contact region, the probing scratch 111 is formed on the surface of the Al layer 107.

After that, when the needle mark after probing is checked, it is determined whether or not this device is a non-defective product by using the first notches 121 or the second notches 123. Specifically, it is determined whether or not the probing scratch 111 is formed in the predetermined region selected from: the region placed on the side of the first region 125 from the boundary P-P'; and the region placed on the side of the second region 129 from the boundary Q-Q'. When the product is confirmed to be non-defective, a conductive member for external connection is bonded to the first region 125 or the second region 129 which is not used as the test probe contact region to become the bonding part 113. Also at this time, using the first notch 121 or the second notch 123, the boundary is detected and the bonding wire is bonded to a region inner than the region determined by the boundary detection. Alternatively, by dissolving a front end of the bonding wire to be shaped like a ball, bonding the ball to the bonding region and then pulling out and removing the wire, a bump may be formed. A material of the conductive member for external connection includes, for example, metal such as Al, Au or Cu.

Next, effects of the semiconductor device 100 (FIGS. 5 and 6) will be described.

In the semiconductor device 100, two sets of the marking notches, namely, the first notches 121 and the second notches 123 are provided in one bonding pad 110. For this reason, using the first notches 121 or the second notches 123, the boundary between the first region 125 and the third region 127 or the boundary between the second region 129 and the third region 127 can be certainly detected. Since two boundaries can be detected, either the first region 125 or the second region 129 can be arbitrarily selected as the bonding part forming region (the region where the bonding part is to be formed). Thus, it becomes possible to certainly provide the bonding part 113 in the selected region and perform probing in the non-selected region. For this reason, the semiconductor device 100 is highly flexible in the selection of the bonding part forming region and can prevent bonding on a scratch caused by contact of the test probe and perform bonding with a high reliability.

In the bonding pad 110, the first region 125 and the second region 129 are disposed symmetrically about the third region 127. Thus, the bonding and probing can be certainly carried out under a same condition indifferent to the selection of the region (which is selected from the first region 125 and the second region 129) where the bonding part 113 is formed. This effect is highly achieved especially when the first region 125 is substantially same as the second region 129 in planar profile.

Figure 2:
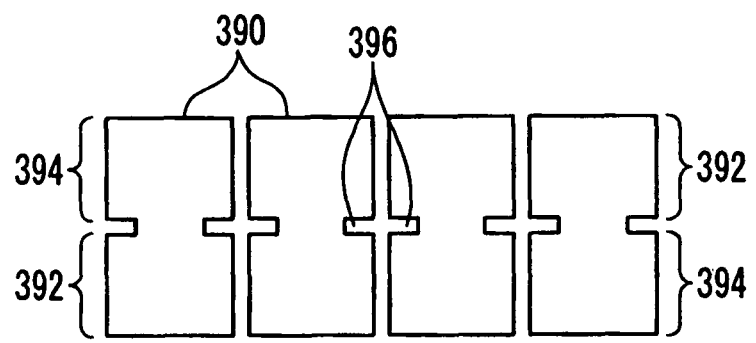
FIG. 2 is the plan view showing a configuration of the conventional semiconductor device.

In the configuration described in BACKGROUND ART referring to FIGS. 1 and 2, there is a room for improvement in miniaturization of the bonding pad and the reliability of bonding. On the contrary, in the bonding pad 110, when any of the first region 125 and the second region 129 is used as the test probe contact region, the third region 127 in addition to these regions can be used as the test probe contact region. For this reason, the bonding part 113 can be certainly provided in a predetermined region while reducing the area of the bonding pad 110. Thus, the reliability of bonding can be sufficiently ensured and an integration degree of the bonding pad 110 on the substrate surface can be improved.

In the other configuration described above referring to Japanese Laid Open Patent Applications JP-P 2001-338955A and JP-P 2001-177066A which are referred in BACKGROUND ART, when the bonding pad is formed, an arrangement of the bonding region and the probe contact region in the bonding pad is determined in advance. For example, in the document JP-P 2001-177066A, a bonding pad with a configuration in which a probing part is formed of a first probing part and a second probing part and the second probing part is located between the first probing part and the bonding part is described. However, with this configuration, the bonding part is shaped like a quadrangular plane and the second probing part is provided to recognize the right angle states of four corners thereof and set the bonding position. The corners of the bonding part define only one boundary between the bonding part and the probing part. That is, this document, the bonding region is previously set at one position in the bonding pad. For this reason, in this document, as distinct from the configuration in the present embodiment, the region formed of the second probing part and the bonding part is not used as the probing part. Thus, the bonding part cannot be freely selected after the formation of the bonding pad.

On the contrary, in the semiconductor device 100 in the present embodiment, the bonding pad 110 is provided with the third region 127 and either of the region formed of the first region 125 and the third region 127 or the region formed of the second region 129 and the third region 127 can be arbitrarily selected as the test probe contact region. For this reason, even when the width of the probing scratch 111 is larger than the width of the bonding part 113, the size of the bonding pad 110 is made minimum necessary size. According to a design change after the formation of the bonding pad 110, the bonding part 113 can be freely disposed.

Thus, in the semiconductor device 100, for example, even when the bonding parts 113 are arranged in the zigzag manner, contact of the probe and bonding can be certainly performed in the respective regions and bonding on the probing scratch can be prevented.

For example, FIG. 7 shows an example in which the bonding parts 113 are arranged in the zigzag manner on the semiconductor device 100 shown in FIG. 5. FIG. 8 shows an example in which the bonding parts 113 are arrange in the zigzag manner using adjacent two bonding pads 110 in one unit on the semiconductor device 100 shown in FIG. 5. According to the present embodiment, since the first notches 121 and the second notches 123 are detected and either the first region 125 or the second region 129 can be arbitrarily selected as the bonding region, the bonding according to the bonding method shown in FIGS. 7 and 8 can be arbitrarily selected after the bonding pads 110 are formed and certainly performed. Thus, the electrical connection between the bonding pads 110 on the semiconductor device 100 and a conductive member provided on the other substrate can be highly flexible. FIG. 9 shows an example in which the bonding pads 110 are connected to external electrodes.

FIG. 9 is a plan view showing an example in which the bonding pads 110 having the bonding part 113 arranged as shown in FIG. 8 are connected to a package substrate 120. In FIG. 9, the package substrate 120 has a power ring 133 disposed along an inner circumference of the substrate and a plurality of stitches 135 disposed outer than the power ring 133 on the substrate. In FIG. 9, the first regions 125 of the bonding pad 110 are connected to the power ring 133 with the wire 131. The second regions 129 of the bonding pad 110 are connected to the nearest stitch 135 with the wire 131.

In FIG. 9, in the bonding pad 110 connected to the power ring 133, the first region 125 is made the bonding part forming region and in the bonding pad 110 connected to the stitch 135, the second region 129 is made the bonding part forming region. In this manner, in the semiconductor device 100, depending on relative position with respect to the conductive member provided on the package substrate 120, the bonding part forming region in the bonding pads 110 can be freely selected. For this reason, the wire 131 can be efficiently arranged so as not to contact against or cross each other.

In the case where a plurality of bonding pads are arranged in a line, all bonding pads need not be the bonding pads 110 having the shape like shown in FIG. 5. That is, all bonding pads do not necessarily have the first notches 121 and the second notches 123 and only need to have at least one, preferably, two or more bonding pads 110 among the bonding pads arranged in a line.

Figure 10:
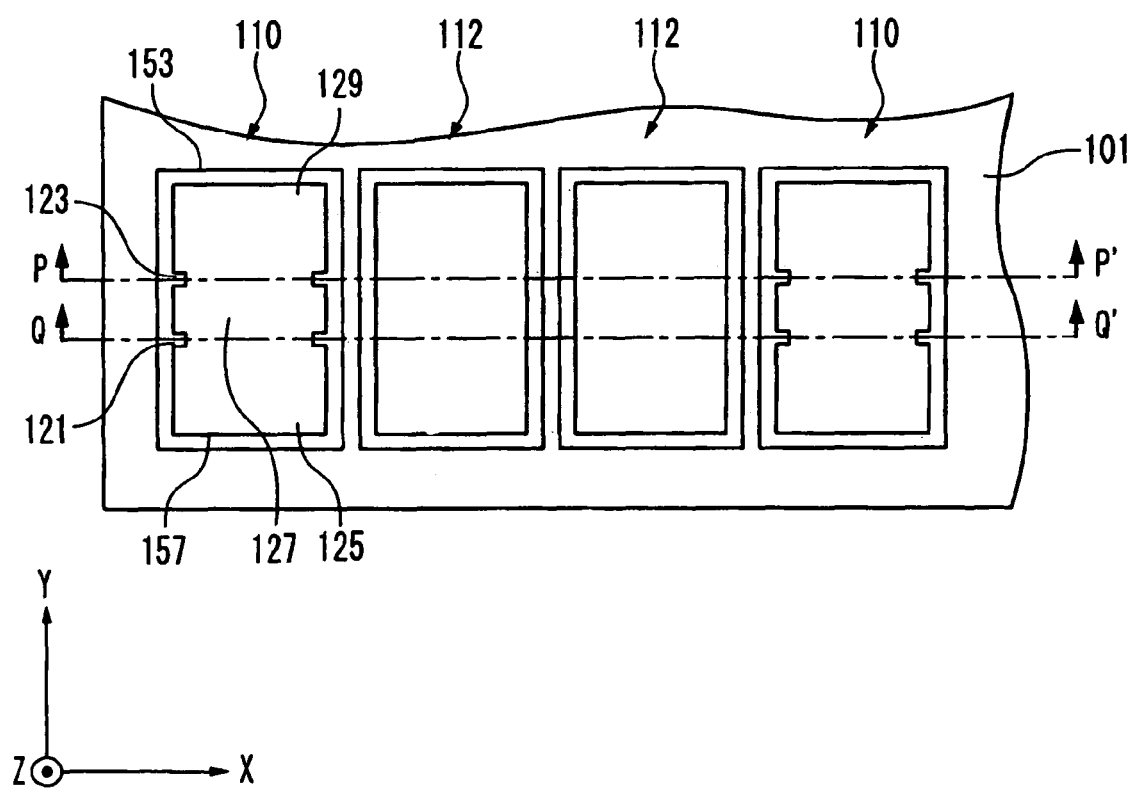
FIG. 10 is the plan view showing a configuration of the semiconductor device in accordance with the present embodiment.

FIG. 10 is a plan view showing an example of an arrangement of a bonding pad 110. In FIG. 10, among the plurality of bonding pads aligned in a line, the bonding pads arranged on both ends are used as the bonding pads 110 having first notches 121 and the second notches 123 and the other bonding pads 112 have no first notches 121 and the second notches 123. Also in this case, since the first notches 121 and the second notches 123 are provided at the bonding pad 110 arranged on the both ends of the aligned bonding pads, and the first notch 121 and the second notch 123, respectively, are arranged on a straight line parallel to the bonding pads arranged direction (parallel to x-axis), the position of the boundary can be detected by using these notches.

Figure 11:
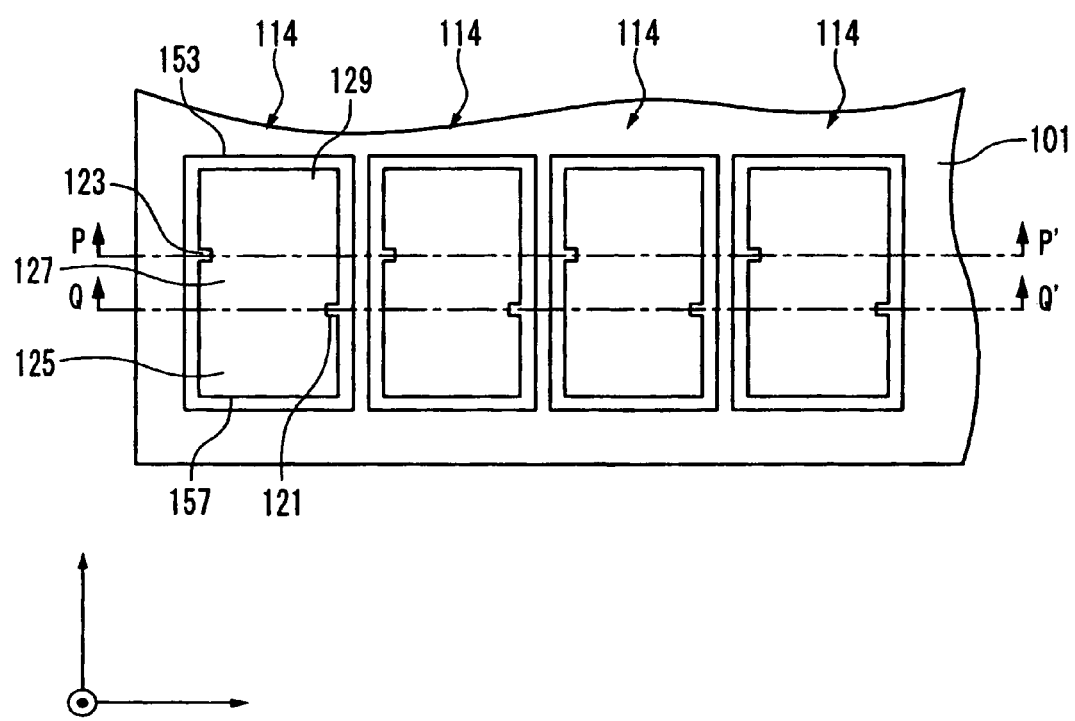
FIG. 11 is the plan view showing a configuration of the semiconductor device in accordance with the present embodiment.

Although FIG. 5 exemplifies the configuration in which the first notches 121 and the second notches 123 are provided both of the two opposed sides, at least one first notch 121 and second notch 123 may be provided at each bonding pad 110. FIG. 11 is a plan view showing such configuration of a semiconductor device. In FIG. 11, bonding pads 114 in place of the bonding pads 110 shown in FIG. 5 are arranged in a line. The basic configuration of the bonding pad 114 is the same as that of the bonding pad 110 shown in FIG. 5. However, the configuration is different from that of the bonding pad 110 in that the first notch 121 is provided on only one of the long sides of the rectangle and the second notch 123 is provided on the other side thereof.

Also in FIG. 11, the first notches 121 and the second notches 123 of the plurality of bonding pads 114, respectively, are arranged on the respective straight line in a row, and by using the first notches 121 and the second notches 123 provided at the plurality of bonding pads 114, positions of the boundary P-P' and the boundary Q-Q' can be detected.

Figure 12:
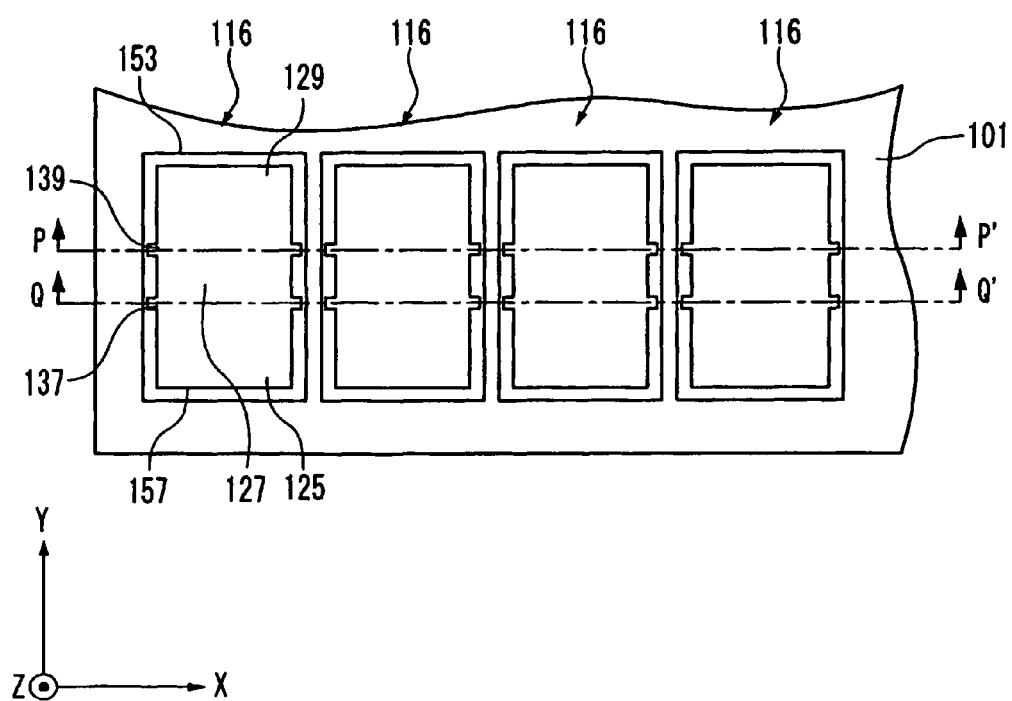
FIG. 12 is the plan view showing a configuration of the semiconductor device in accordance with the present embodiment.

As described above, the boundary between the first region 125 and the third region 127 and the boundary between the second region 129 and the third region 127 are indicated by the notches. However, the boundaries may be protrusions formed so as to protrude from the inside of the bonding pad 110 toward the outer circumference, in place of the notches. FIG. 12 is a plan view showing such configuration of a semiconductor device. A basic configuration of the semiconductor device in FIG. 12 is the same as that of the semiconductor device 100 in FIG. 5. However, the configuration is different from the configuration of the semiconductor device 100 in that a plurality of bonding pads 116 in place of the plurality of bonding pad 110 are arranged in a line. The bonding pad 116 has first protrusions 137 and second protrusions 139 in place of the first notches 121 and the second notches 123. Like the notches, these protrusions can be provided on the depressed portion side wall 157 of the multilayer 103.

With the configuration shown in FIG. 12, as in the case of the configuration having notches, by using the first protrusions 137 and the second protrusions 139, the boundary between the first region 125 and the third region 127 and the boundary between the second region 129 and the third region 127 can be detected. Thus, this semiconductor can achieve the same effects as those obtained by the semiconductor device 100 shown in FIG. 5.

Since the bonding pad can be made smaller by providing the notches on the bonding pad to indicate the boundaries as in the case shown in FIG. 5 and other figures, the integration level of the bonding pad can be further improved.

Hereinafter, differences between the following embodiment and the first embodiment will be mainly described.

Second Embodiment

In the first embodiment, the notches or the protrusions are provided on the depressed portion side wall 157 for the detection of the boundaries. However, the method of forming the mark for indicating the boundaries is not limited to this. For example, the area indication marks may be corners provided at the depressed portion 155. In the configuration in which the corners of the depressed portion 155 are the area indication marks, for example, the third region 127 is pulled in or out from the long side of the rectangle with respect to the first region 125 and the second region 129. In the present embodiment, such configuration will be described.

Figure 13:
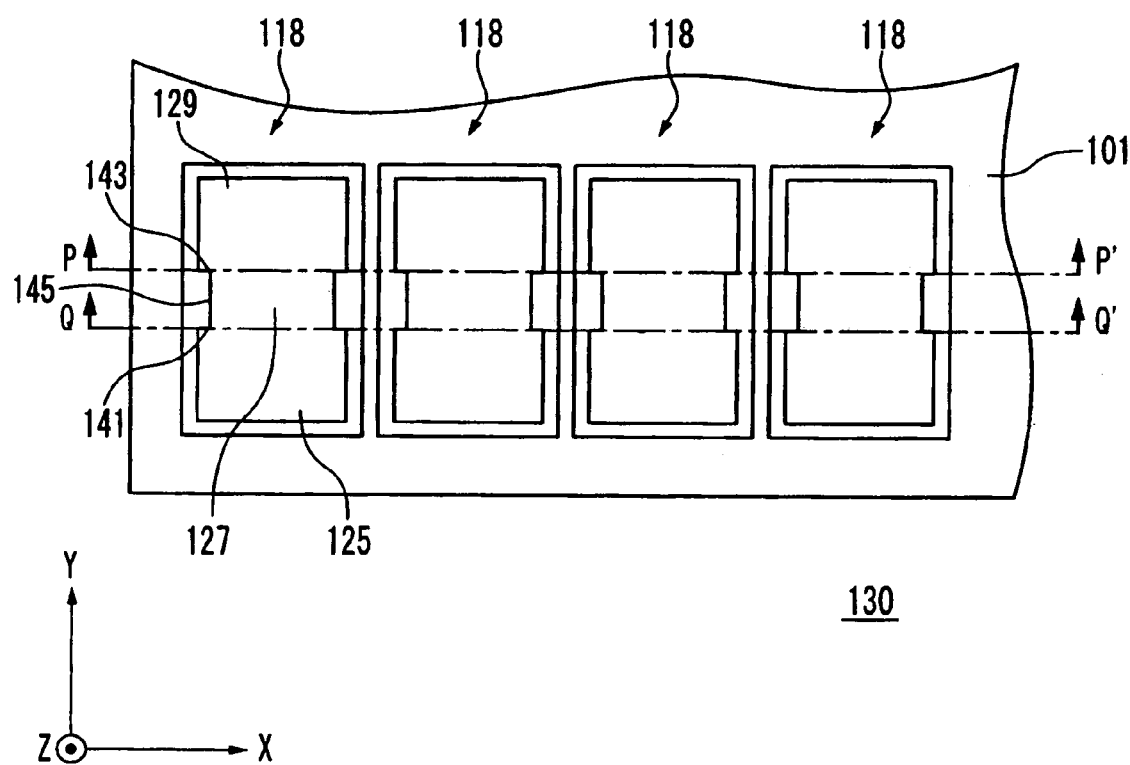
FIG. 13 is the plan view showing a configuration of the semiconductor device in accordance with the present embodiment.

FIG. 13 is a plan view showing the configuration of the semiconductor device in the present embodiment. The basic configuration of the semiconductor device 130 shown in FIG. 13 is the same as that of the semiconductor device 100 in the first embodiment (shown in FIG. 5). However, the configuration is different from the semiconductor device 100 in that a plurality of bonding pads 118 in place of the bonding pads 110 are arranged in a line.

In the bonding pad 118, the depressed portion side wall 157 in the longitudinal direction has a retreated portion 145 having planar shape of square. First corner 141 and second corner 143 which are provided on both ends of the retreated portion 145 indicate boundaries of regions. The first corners 141 indicate the boundary between the first region 125 and the third region 127. The second corners 143 indicate the boundary between the second region 129 and the third region 127.

In FIG. 13, since the boundary between the first region 125 and the third region 127 and the boundary between the second region 129 and the third region 127 can be detected using the first corners 141 and the second corners 143, the effect same to the first embodiment can be achieved by the present embodiment. Furthermore, in FIG. 13, the retreated portions 145 may be formed on the depressed portion side wall 157. Thus, the semiconductor device can be manufactured more easily without requiring micromachining in providing the notches and the protrusions.

Figure 14:
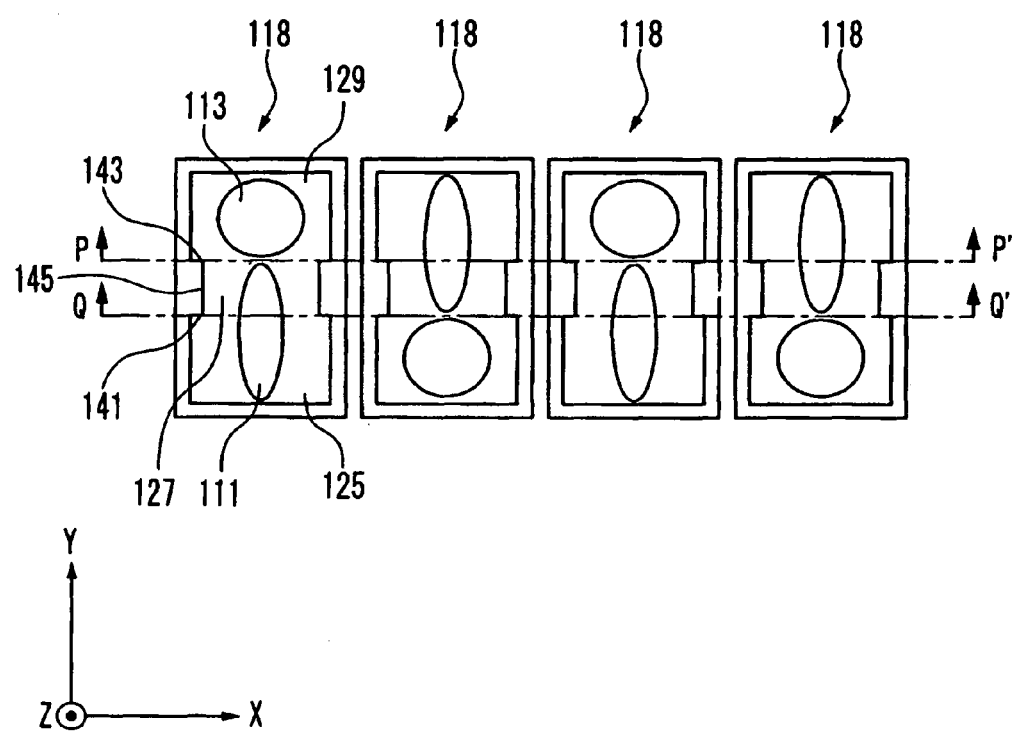
FIG. 14 is the plan view showing a configuration of the semiconductor device in accordance with the present embodiment.
Figure 15:
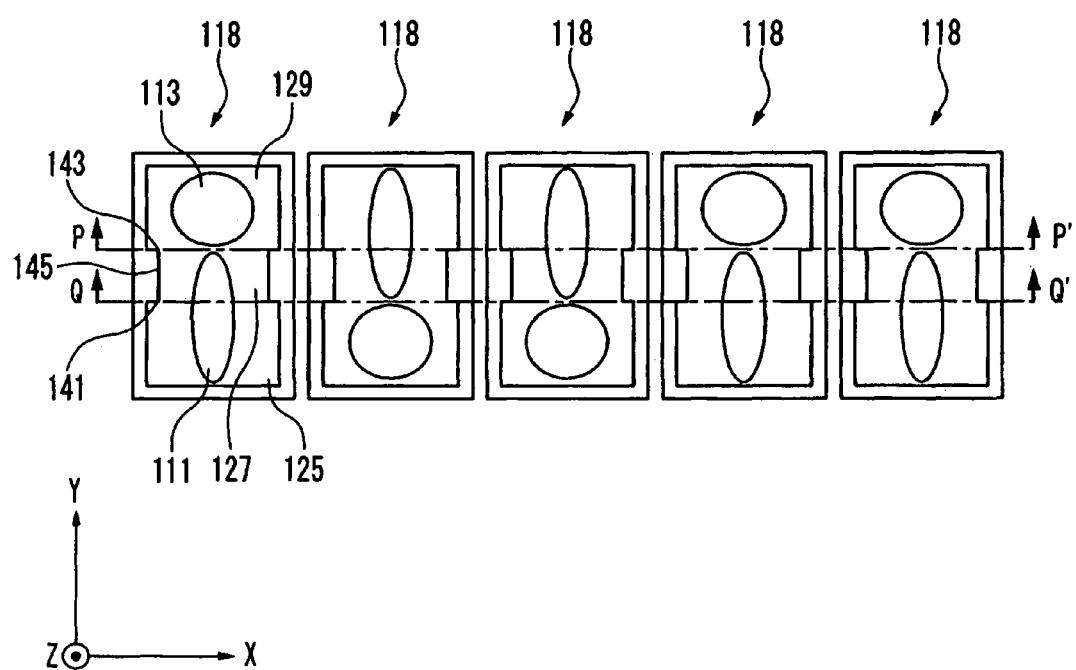
FIG. 15 is the plan view showing a configuration of the semiconductor device in accordance with the present embodiment.

In the semiconductor device 130, the planar arrangement of the bonding parts 113 may be arranged in the zigzag manner. FIG. 14 is a plan view showing an example in which the bonding parts 113 are arranged in the zigzag manner on the semiconductor device 130. FIG. 15 is a plan view showing an example in which the bonding parts 113 are arranged in the zigzag manner using the two adjacent bonding parts 113 as one unit in the semiconductor device 130.

Figure 16:
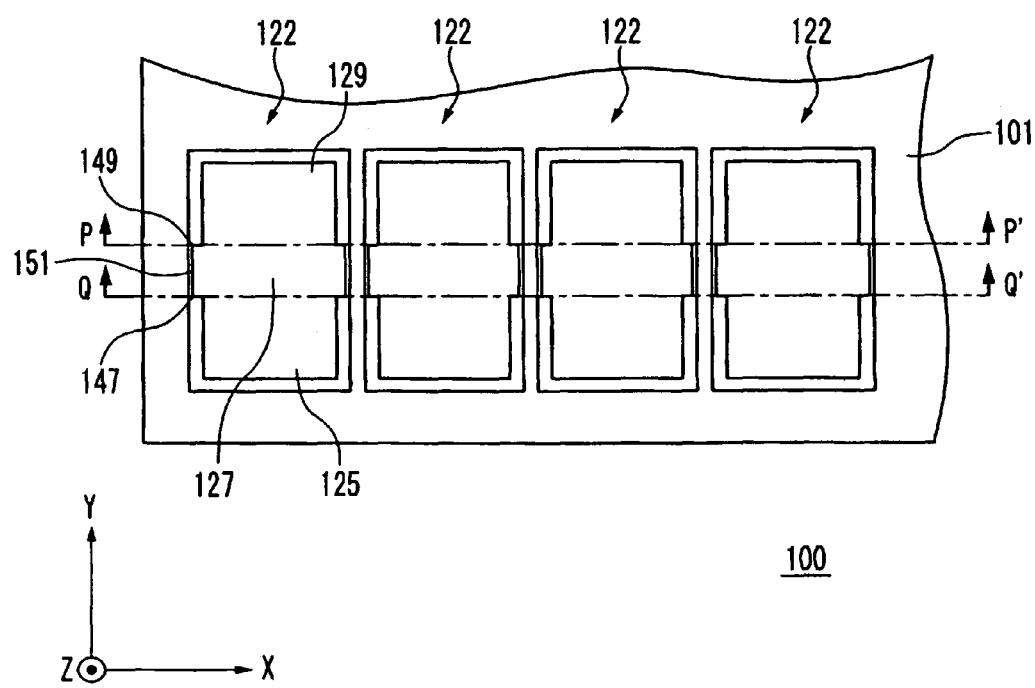
FIG. 16 is the plan view showing a configuration of the semiconductor device in accordance with the present embodiment.

In the semiconductor device 130, the third region 127 is made narrower than the first region 125 and the second region 129 in width (in the direction parallel to the arrangement direction of the bonding pads, namely, x-axis in the drawing). However, the third region 127 may be made wider in width than those inversely. FIG. 16 is a plan view showing such configuration of the semiconductor device.

A basic configuration of the semiconductor device shown in FIG. 16 is the same as that of the semiconductor device 130 shown in FIG. 12. However, the configuration is different from the semiconductor device 130 in that a plurality of bonding pads 122 in place of the bonding pads 118 are provided. In the bonding pad 122, in place of the retreated portions 145, advanced portions 151 are provided on the depressed portion side wall 157. One end of the advanced portions 151 form first corners 147 indicating the boundary between the first region 125 and the third region 127. The other ends of the advanced portions 151 form second corners 149 indicating the boundary between the second region 129 and the third region 127. In FIG. 16, the same effects as in FIG. 12 can be obtained.

Although the embodiments of the present invention have been described referring to drawings, the embodiments are only examples of the present invention and other various configurations can be adopted.

For example, although the passivation layer formed on the bonding pad is the polyimide layer 105 in the above-mentioned embodiments, the passivation layer may be an oxide layer such as a $SiO_2$ layer or a nitride layer such as a SiN layer in place of the organic insulating layer such as the polyimide layer. In this case, the area indication marks can be formed of recessions and protrusions of the opening ends of the oxide layer such as the $SiO_2$ layer or the nitride layer such as the SiN layer and the same effects as in the above-mentioned embodiments can be obtained. The passivation layer may have a single layer or a laminated layer formed by laminating a plurality of layers.

In the above-mentioned embodiments, since the depressed portion 155 is formed on the multilayer 103 and the first notches 121 and the second notches 123 are formed on the outer circumference of the depressed portion 155, even when the passivation layer is made of a material which cannot be easily microfabricated, the first notches 121 and the second notches 123 can be stably formed at predetermined positions.

The conductive layer forming the bonding pad is not limited to the Al layer 107 and the other layers such as metal layers including an AU layer and a Cu layer may be adopted.

Although a part of the forming region for the Al layer 107 is covered with the polyimide layer 105 and the outline of the opening of the polyimide layer 105 is the outline of the bonding pad as described above, all of the forming region of the Al layer 107 may be exposed and the outline of the forming region of the Al layer 107 may be the outline of the bonding pad.

In the above description, a case is exemplified in which the probing scratches 111 and the bonding parts 113 are arranged in the zigzag manner in the plurality of aligned bonding pad arranged in a row, however, the probing scratch 111 and the bonding part 113 need not be arranged in the zigzag manner and may be arranged randomly.

What is claimed is:

1. A semiconductor device comprising:
   pads formed on a chip; and
   a mark formed on each of said pads,
   wherein said each pad includes a first region, a second region, and a third region placed between said first region and said second region,
   wherein said mark includes:
      a first mark configured to designate a first boundary between said first region and said third region; and
      a second mark configured to designate a second boundary between said second region and said third region,
   wherein said pads include a first pad and a second pad being adjacent to the first pad,
   wherein the first region and the third region in said first pad comprise a region for probing, and
   the second region and the third region in said second pad comprise a region for probing.

2. The semiconductor device according to claim 1, wherein said first pad and said second pad are formed on a first side of said chip, and
   a distance from said first region to said first side of said chip is smaller than a distance from said second region to said first side of said chip in each of said first pad and said second pad.

3. The semiconductor device according to claim 2, further comprising:
   a first wire having one end that is connected to said second region of said first pad; and
   a second wire having one end that is connected to said first region of said second pad.

4. The semiconductor device according to claim 3, further comprising an interconnection substrate,
   wherein another end of said first wire and another end of said second wire are connected to electrodes formed on said interconnection substrate respectively.

5. The semiconductor device according to claim 4, wherein a distance from said another end of the first wire to said first side of said chip is larger than a distance from said another end of said second wire to said first side of said chip.

6. The semiconductor device according to claim 2, wherein said first pad and said second pad are formed on the first side of said chip, and said each pad has a rectangular shape with a short side that comprises said first side of the chip.

7. The semiconductor according to claim 6, wherein said first mark and said second mark of said first pad are formed on a long side of said rectangular shape as a notch or a protrusion which are separated from each other.

8. The semiconductor device according to claim 1, wherein said first mark and said second mark are formed to be visible.

9. The semiconductor device according to claim 1, wherein said first region, said third region and said second region are arranged in this order in a line, and a profile of said bonding pad is axisymmetric about a central axis vertical to said line.

10. The semiconductor device according to claim 1, wherein a profile of a region comprising said first region and said third region and a profile of a region comprising said second region and said third region are substantially same in each of said first pad and said second pad.

11. The semiconductor device according to claim 1, further comprising:
   a semiconductor substrate;
   an insulating layer formed on said semiconductor substrate and having a depressed portion of a predetermined profile; and
   a conductive layer configured to cover said depressed portion,
   wherein said first mark and said second mark are respectively formed on a side surface of an outer circumference of said depressed portion.

12. The semiconductor device according to claim 11, wherein said first mark and said second mark in said first pad are formed on said side surface and said outer circumference of said depressed portion as a notch or a protrusion.

* * * * *